(12) United States Patent
Kishimoto et al.

(10) Patent No.: US 11,555,656 B2
(45) Date of Patent: Jan. 17, 2023

(54) VAPOR CHAMBER

(71) Applicant: Murata Manufacturing Co., Ltd., Nagaokakyo (JP)

(72) Inventors: Atsushi Kishimoto, Nagaokakyo (JP); Osamu Chikagawa, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 177 days.

(21) Appl. No.: 16/922,248

(22) Filed: Jul. 7, 2020

(65) Prior Publication Data

US 2020/0333081 A1 Oct. 22, 2020

Related U.S. Application Data

(63) Continuation of application No. PCT/JP2019/041257, filed on Oct. 21, 2019.

(30) Foreign Application Priority Data

Nov. 16, 2018 (JP) .............................. JP2018-215499

(51) Int. Cl.
*F28D 15/02* (2006.01)
*F28D 15/04* (2006.01)
(Continued)

(52) U.S. Cl.
CPC ....... *F28D 15/0233* (2013.01); *F28D 15/046* (2013.01); *F28F 3/12* (2013.01);
(Continued)

(58) Field of Classification Search
CPC ...... F28D 15/02; F28D 15/04; F28D 15/0233; F28D 15/046; F28F 21/08; F28F 3/12;
(Continued)

(56) References Cited

U.S. PATENT DOCUMENTS 6,276,444 B1 8/2001 Li et al.
6,397,935 B1 6/2002 Yamamoto et al.
(Continued)

FOREIGN PATENT DOCUMENTS

JP H08268438 A 10/1996
JP 2000243237 A 9/2000
(Continued)

OTHER PUBLICATIONS

International Search Report Issued for PCT/JP2019/041257 dated Dec. 3, 2019.
(Continued)

*Primary Examiner* — Harry E Arant
(74) *Attorney, Agent, or Firm* — ArentFox Schiff LLP

(57) ABSTRACT

A vapor chamber that includes a housing having a first sheet and a second sheet facing each other, wherein at least a part of an outer edge of the housing has a step shape in which an end portion of the second sheet is positioned inside an end portion of the first sheet, and the housing has a bonded portion inside the end portion of the second sheet where the first sheet and the second sheet are bonded to each other; a protective film covering a boundary between the end portion of the second sheet and the first sheet at the step shape; a working fluid enclosed in the housing, and a wick on an inner wall surface of the first sheet or the second sheet.

16 Claims, 2 Drawing Sheets

(51) Int. Cl.
*F28F 3/12* (2006.01)
*F28F 21/08* (2006.01)
*H05K 7/20* (2006.01)

(52) U.S. Cl.
CPC ....... *F28F 21/081* (2013.01); *H05K 7/20336* (2013.01); *F28F 2275/06* (2013.01)

(58) Field of Classification Search
CPC ...... F28F 21/081; F28F 2275/06; H05K 7/20; H05K 7/20336
See application file for complete search history.

(56) References Cited

U.S. PATENT DOCUMENTS

| | | | |
|---|---|---|---|
| 10,119,770 | B2 | 11/2018 | Aoki et al. |
| 2007/0068657 | A1* | 3/2007 | Yamamoto ............ H01L 23/427 165/80.4 |
| 2008/0080133 | A1 | 4/2008 | Yang et al. |
| 2011/0192004 | A1 | 8/2011 | Wang |
| 2013/0043397 | A1* | 2/2013 | Toyama ................... G21K 4/00 250/361 R |
| 2014/0360701 | A1* | 12/2014 | Aoki ....................... F28D 15/04 165/104.21 |
| 2017/0248378 | A1 | 8/2017 | Aoki et al. |

FOREIGN PATENT DOCUMENTS

| | | |
|---|---|---|
| JP | 2001124481 A | 5/2001 |
| JP | 2007003164 A | 1/2007 |
| JP | 2007093033 A | 4/2007 |
| JP | 2011166121 A | 8/2011 |
| JP | 5788069 B1 | 9/2015 |

OTHER PUBLICATIONS

Written Opinion of the International Searching Authority issued for PCT/JP2019/041257 dated Dec. 3, 2019.

* cited by examiner

FIG. 1
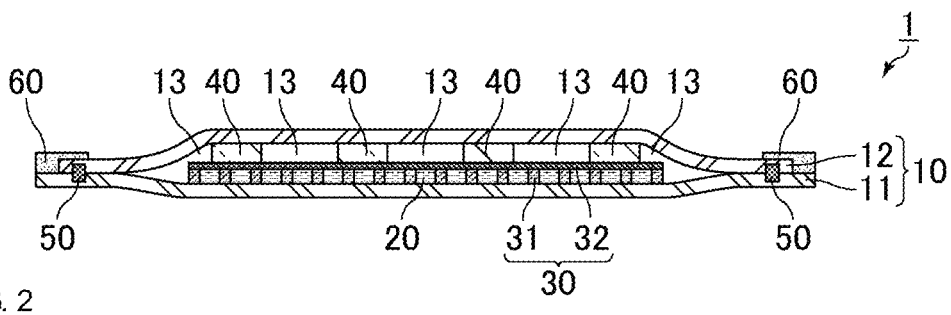
FIG. 2
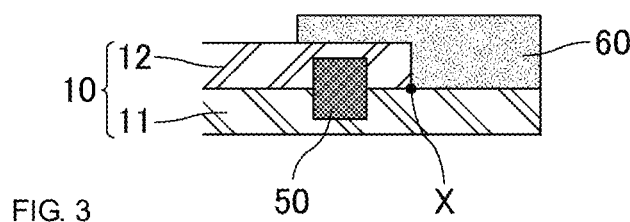
FIG. 3
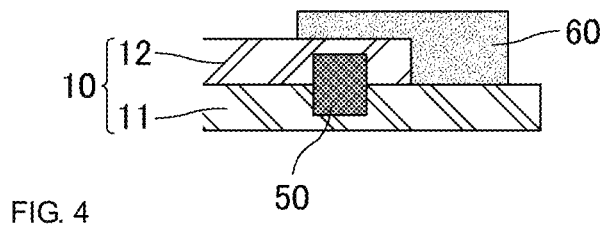
FIG. 4
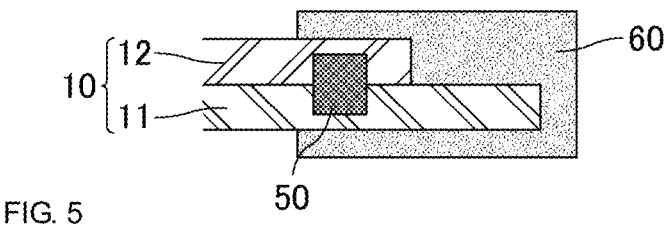
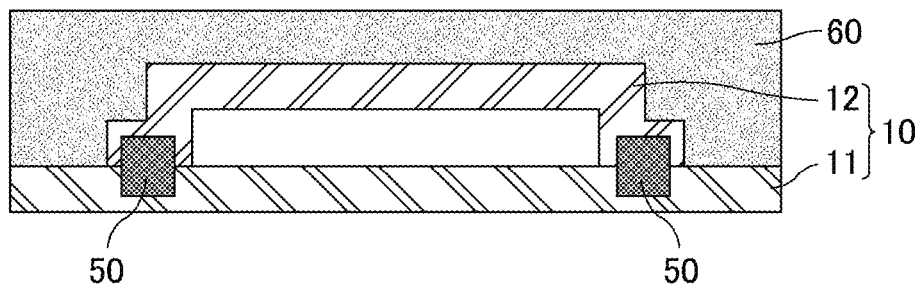

VAPOR CHAMBER

CROSS REFERENCE TO RELATED APPLICATIONS

The present application is a continuation of International application No. PCT/JP2019/041257, filed Oct. 21, 2019, which claims priority to Japanese Patent Application No. 2018-215499, filed Nov. 16, 2018, the entire contents of each of which are incorporated herein by reference.

FIELD OF THE INVENTION

The present invention relates to a vapor chamber.

BACKGROUND OF THE INVENTION

In recent years, the amount of heat generated in an element has been increased due to high integration and high performance. Further, since the heating density is increased due to the progress in miniaturization of the product, measures against heat radiation have become important. This situation is more prominent in mobile terminals such as smart phones and tablets, and thermal design thereof becomes very difficult. A graphite sheet or the like has been used as a heat countermeasure, but the heat transportation amount thereof is not sufficient.

As a heat countermeasure having high heat transportation capacity, a vapor chamber which is a planar heat pipe has been proposed. The total apparent thermal conductivity of a vapor chamber is several times to several tens of times better than that of metals such as copper and aluminum.

A vapor chamber generally has a structure in which a wick for transporting a working fluid by capillary force is provided inside a housing and the working fluid is enclosed therein. The working fluid absorbs heat from a heat generation element in an evaporation portion and evaporates in the vapor chamber. The working fluid which is in a gas phase moves to a condensation portion, and is cooled to be returned to a liquid phase. The working fluid returned to the liquid phase is moved to a heat generation element side (evaporation portion) again by the capillary force of the wick and cools the heat generation element. By repeating this cycle, the vapor chamber is able to operate autonomously without having external power and is able to diffuse heat two dimensionally at high speed by utilizing evaporation latent heat and condensation latent heat of the working fluid.

For example, Patent Document 1 discloses a heat pipe or a vapor chamber in which a groove portion connected to an evaporation portion and a condensation portion is formed in a hollow interior of a sealed structure, and the working fluid is enclosed in the hollow interior portion. Example 1 of Patent Document 1 describes that a flange portion is formed as a protrusion in an outer circumferential direction in each of a lower container and an upper container constituting a container, the open ends are bonded to each other, and an outer circumferential edge of the flange portion is sealed by a sealing means such as welding, brazing or adhesion.

Patent Document 2 discloses a sheet-like heat pipe including a working fluid, a sheet-like partition plate, a sheet-like container, and a sealing layer. The sheet-like partition plate is composed of a spacer having a liquid flow path through which the working fluid passes and a gas flow path through which the vapor of the working fluid passes. The sheet-like container is composed of at least two sealing sheets including the working fluid and the partition plate therein. The sealing layer hermetically seals the outer surface of the sheet-like container. According to Patent Document 2, since the outer surface of the sheet-like container is sealed by the sealing layer, high sheet performance may be secured.

Patent Document 1: Japanese Unexamined Patent Application Publication No. 2007-3164

Patent Document 2: Japanese Unexamined Patent Application Publication No. 2007-93033

SUMMARY OF THE INVENTION

In the sheet-like heat pipe described in Patent Document 2, a sealing layer made of a metal film and a resin film is formed on an entire outer surface of the sheet-like container. When the sealing layer (hereinafter also referred to as a protective film) is formed on an entire outer wall surface of a housing constituting a vapor chamber, leakage may be reliably prevented. However, increasing in the overall thickness of the vapor chamber may cause a fatal problem especially when used in a small electronic device.

Usually, leakage is likely to occur from a portion where the sheets constituting the housing are bonded. Therefore, it is conceivable that a protective film is formed only around an end portion of each sheet to cover a boundary between the bonded sheets, thereby preventing leakage from the bonded portion and suppressing the overall thickness of the vapor chamber.

However, when the protective film is abraded during handling or the like, the boundary between the bonded sheets may be exposed. In order to prevent a situation above, it may be conceivable to form a protective film so as to largely extend further than the end portion of each sheet to a surface direction, however, the overall size of the vapor chamber becomes large since the vapor chamber spreads in the surface direction.

The present invention has been made to solve the above problems, and an object of the present invention is to provide a vapor chamber capable of preventing leakage from a bonded portion while reducing the overall size of the vapor chamber.

A vapor chamber of the present invention includes a housing having a first sheet and a second sheet facing each other, wherein at least a part of an outer edge of the housing has a step shape in which an end portion of the second sheet is positioned inside an end portion of the first sheet, and the housing has a bonded portion inside the end portion of the second sheet where the first sheet and the second sheet are bonded to each other; a protective film covering a boundary between the end portion of the second sheet and the first sheet at the step shape; a working fluid enclosed in the housing, and a wick on an inner wall surface of the first sheet or the second sheet.

According to the present invention, it is possible to provide a vapor chamber capable of preventing leakage from a bonded portion and reducing the overall size of the vapor chamber.

BRIEF DESCRIPTION OF THE DRAWINGS

FIG. 1 is a sectional view schematically illustrating an example of a vapor chamber of the present invention.

FIG. 2 is an enlarged sectional view of a protective film provided in the vapor chamber illustrated in FIG. 1.

FIG. 3 is an enlarged sectional view schematically illustrating an example in which an outer circumferential end portion of the protective film is positioned inside an end portion of a first sheet.

FIG. 4 is an enlarged sectional view schematically illustrating an example in which the protective film is provided on an outer wall surface of the first sheet positioned on an opposite side of a second sheet.

FIG. 5 is an enlarged sectional view schematically illustrating an example in which the protective film is provided on an entire outer wall surface of the second sheet.

DETAILED DESCRIPTION OF THE PREFERRED EMBODIMENTS

Figure 6A:
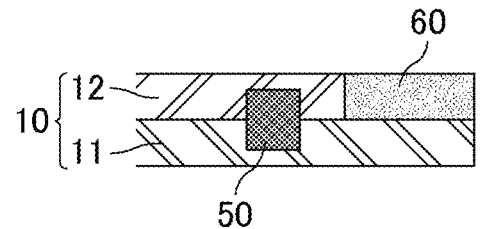
FIG. 6A, FIG. 6B, FIG. 6C, FIG. 6D, FIG. 6E, and FIG. 6F are enlarged sectional views schematically illustrating another example of the protective film provided in the vapor chamber of the present invention.

Hereinafter, a vapor chamber of the present invention will be described.

However, the present invention is not limited to the following configuration, and may be appropriately modified without departing from the spirit and scope of the present invention. It is to be understood that a combination of two or more of the individual desirable configurations of the present invention described below is also an embodiment of the present invention.

Each of the embodiments described below is illustrative, and needless to say, a partial replacement or combination of the configurations described in the different embodiments is possible.

FIG. 1 is a sectional view schematically illustrating an example of a vapor chamber of the present invention.

A vapor chamber 1 illustrated in FIG. 1 includes a housing 10 configured of a first sheet 11 and a second sheet 12 facing each other, a working fluid 20 enclosed in the housing 10, and a wick 30 provided on an inner wall surface of the housing 10. As illustrated in FIG. 1, the vapor chamber 1 preferably includes a plurality of struts 40 between the first sheet 11 and the second sheet 12. The housing 10 has a cavity 13 therein, and the first sheet 11 and the second sheet 12 are supported by the struts 40 to secure the cavity 13. The first sheet 11 and the second sheet 12 are bonded together at an outer edge. In the vapor chamber 1 illustrated in FIG. 1, the wick 30 is provided on the inner wall surface of the first sheet 11. The wick 30 includes a plurality of projecting portions 31 disposed at prescribed intervals on the inner wall surface of the first sheet 11 and a mesh 32 disposed on the projecting portions 31.

In the vapor chamber 1 illustrated in FIG. 1, an outer edge of the housing 10 is formed in a step shape in which an end portion of the second sheet 12 is positioned inside an end portion of the first sheet 11. The housing 10 includes a bonded portion 50 inside the end portion of the second sheet 12 forming the step shape where the first sheet 11 and the second sheet 12 are bonded together. The bonded portion 50 is provided in a circumferential portion without a break in a plan view of the vapor chamber.

As illustrated in FIG. 1, an outer wall surface of the housing 10 includes a region where a protective film 60 is provided and a region where the protective film 60 is not provided. In FIG. 1, the protective film 60 is not provided on the outer wall surface of the first sheet 11 and the outer wall surface of the second sheet 12 at a portion of the housing where the first sheet 11 and the second sheet 12 are not in contact with each other (i.e., at a position toward the center or inside of the vapor chamber). In another aspect, the protective film 60 is not provided on the outer wall surface of the first sheet 11 on the opposite side of the second sheet 12.

FIG. 2 is an enlarged sectional view of the protective film provided in the vapor chamber illustrated in FIG. 1.

As illustrated in FIG. 2, the protective film 60 is provided on the outer wall surface of the first sheet 11 positioned on a side of the second sheet 12 so as to cover the boundary between the end portion of the second sheet 12 and the first sheet 11 forming the step shape (portion indicated by X in FIG. 2). In FIG. 2, the protective film 60 is also provided on the outer wall surface of the second sheet 12, and extends further than the outer wall surface of the second sheet 12 in a height direction (up-down direction in FIG. 2). In a surface direction (left-right direction in FIG. 2), an outer circumferential end portion of the protective film 60 coincides with the end portion of the first sheet 11.

In the vapor chamber of the present invention, at least a part of the outer edge of the housing has a step shape, a region where the protective film is provided and a region where the protective film is not provided on the outer wall surface of the housing exists, and the protective film is provided so as to cover the boundary between the end portion of the second sheet and the first sheet forming the step shape.

In a case where the protective film is provided on the step portion of the first sheet and the second sheet, even when the protective film is abraded during handling or the like, it is less likely that the boundary between the first sheet and the second sheet is exposed unlike in a case where the protective film is provided on a portion where the end portions of the first sheet and the second sheet coincide with each other, thereby preventing leakage from a bonded portion. Further, since the protective film is provided on the step portion of the first sheet and the second sheet, it is less likely that stress is applied to the boundary between the first sheet and the second sheet, so that peeling of the protective film may be prevented. Further, since the protective film is not provided on the entire outer wall surface of the housing but the protective film is provided around the bonded portion, the overall size of the vapor chamber may be reduced.

FIG. 3 is an enlarged sectional view schematically illustrating an example in which the outer circumferential end portion of the protective film is positioned inside the end portion of the first sheet 11.

In FIG. 3, the outer circumferential end portion of the protective film 60 is positioned inside the end portion of the first sheet 11 in the direction toward the center of the vapor chamber.

In the vapor chamber of the present invention, it is preferable that the outer circumferential end portion of the protective film coincide with the end portion of the first sheet 11 as illustrated in FIG. 2 or be positioned inside the end portion of the first sheet 11 as illustrated in FIG. 3.

In a case where the outer circumferential end portion of the protective film coincides with the end portion of the first sheet 11 or the outer circumferential end portion of the protective film is positioned inside the end portion of the first sheet 11, even when stress is applied to the protective film from the second sheet 12 side to the first sheet 11 side, the protective film is hardly peeled off.

In the vapor chamber of the present invention, it is preferable that the protective film not be provided on at least one of the outer wall surface of the first sheet and the outer wall surface of the second sheet in a portion of the housing where the first sheet and the second sheet are not in contact with each other, i.e., in a direction from the bonded portion toward the center of the vapor chamber.

The portion where the first sheet and the second sheet are not in contact with each other inside the bonded portion is where the cavity between the first sheet and the second sheet exists, and is thicker than a portion where the first sheet and the second sheet are in contact with each other. When the protective film is not provided on the outer wall surface of the portion where the first sheet and the second sheet are not in contact with each other, the maximum thickness of the overall vapor chamber does not increase, so that the overall thickness of the vapor chamber may be as small as possible.

From a viewpoint of suppressing the overall thickness of the vapor chamber, as illustrated in FIG. 1 and FIG. 2, it is more preferable that no protective film be provided on both of the outer wall surface of the first sheet 11 and the outer wall surface of the second sheet 12 in a portion where the first sheet 11 and the second sheet 12 are not in contact with each other.

In a case where the protective film is not provided on at least one of the outer wall surface of the first sheet and the outer wall surface of the second sheet in a portion where the first sheet and the second sheet are not in contact with each other, the protective film may be provided on the outer wall surface of the first sheet on the opposite side of the second sheet outside the bonded portion.

FIG. 4 is an enlarged sectional view schematically illustrating an example in which the protective film is provided on the outer wall surface of the first sheet 11 on the opposite side of the second sheet 12.

Similarly to FIG. 1 and FIG. 2, in a case where the protective film 60 is not provided on the outer wall surface of the first sheet 11 and the outer wall surface of the second sheet 12 at a portion where the first sheet 11 and the second sheet 12 are not in contact with each other on a direction inside of the bonded portion 50, the protective film 60 may be provided on the outer wall surface of the first sheet 11 on the opposite side of the second sheet 12 outside the bonded portion 50 as illustrated in FIG. 4. In FIG. 4, the outer circumferential end portion of the protective film 60 is positioned outside the end portion of the first sheet 11, but may coincide with the end portion of the first sheet 11.

In addition, in the vapor chamber of the present invention, when the entire outer edge of the housing has a step shape, it is preferable that no protective film be provided on the outer wall surface of the first sheet positioned on the opposite side of the second sheet.

When no protective film is provided on the outer wall surface of the first sheet positioned on the opposite side of the second sheet, the overall thickness of the vapor chamber may be suppressed as compared with a case where the protective film is provided over the entire outer wall surface of the housing.

In a case where the entire outer edge of the housing has a step shape and the outer wall surface of the first sheet positioned on the opposite side of the second sheet is not provided with the protective film, the protective film may be provided on the outer wall surface of the second sheet in a portion where the first sheet and the second sheet are not in contact with each other in a direction toward the inside of the bonded portion, for example, the protective film may be provided on the entire outer wall surface of the second sheet.

FIG. 5 is an enlarged sectional view schematically illustrating an example in which the protective film is provided on the entire outer wall surface of the second sheet 12.

As illustrated in FIG. 5, when the protective film 60 is not provided on the outer wall surface of the first sheet 11 positioned on the opposite side of the second sheet 12, the protective film 60 may be provided on the entire outer wall surface of the second sheet 12. In FIG. 5, the outer circumferential end portion of the protective film 60 coincides with the end portion of the first sheet 11 in the surface direction, but may be positioned inside the end portion of the first sheet 11.

FIG. 6A, FIG. 6B, FIG. 6C, FIG. 6D, FIG. 6E, and FIG. 6F are enlarged sectional views schematically illustrating another example of the protective film provided on the vapor chamber according to the present invention.

Figure 6B:
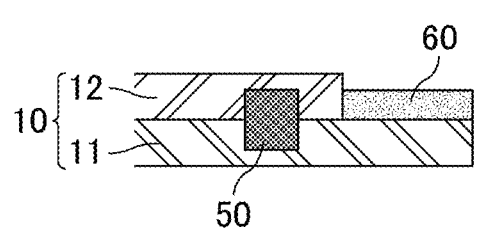

In FIG. 6A and FIG. 6B, the protective film 60 does not extend further than the outer wall surface of the second sheet 12 in the height direction, and the outer circumferential end portion of the protective film 60 coincides with the end portion of the first sheet 11 in the surface direction. In FIG. 6A, the protective film 60 has the same thickness as that of the second sheet 12, and in FIG. 6B, the protective film 60 is thinner than the second sheet 12.

Figure 6C:
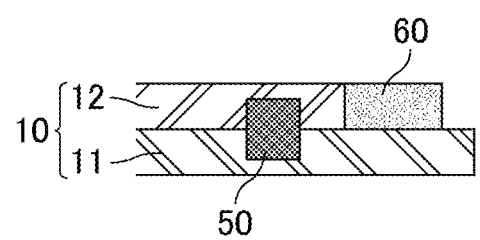
Figure 6D:
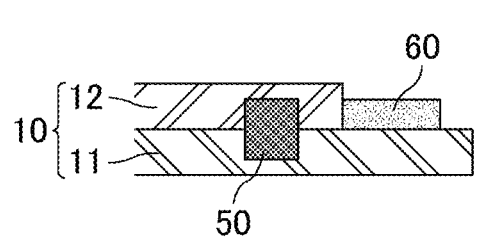

In FIG. 6C and FIG. 6D, the protective film 60 does not extend further than the outer wall surface of the second sheet 12 in the height direction, and the outer circumferential end portion of the protective film 60 is positioned inside the end portion of the first sheet 11 in the surface direction. In FIG. 6C, the protective film 60 has the same thickness as that of the second sheet 12, and in FIG. 6D, the protective film 60 is thinner than the second sheet 12.

Figure 6E:
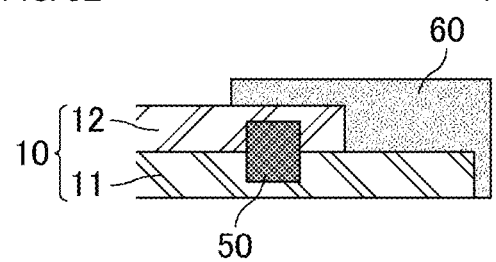
Figure 6F:
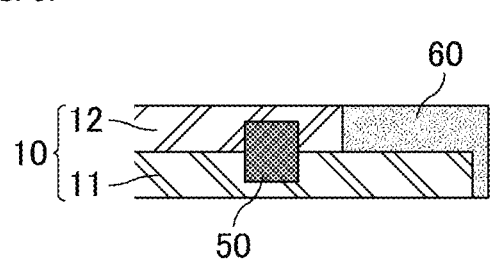

In FIG. 6E and FIG. 6F, the outer circumferential end portion of the protective film 60 is positioned outside the end portion of the first sheet 11, and the protective film 60 is provided also on an end surface of the first sheet 11. In FIG. 6E, the protective film 60 extends further than the outer wall surface of the second sheet 12 in the height direction, and in FIG. 6F, the protective film 60 does not extend further than the outer wall surface of the second sheet 12 in the height direction. Although the protective film 60 in the portion positioned inside the end portion of the first sheet 11 has the same thickness as that of the second sheet 12 in FIG. 6F, the protective film 60 in the portion positioned inside the end portion of the first sheet 11 may be thinner than the second sheet 12.

Figure 7:
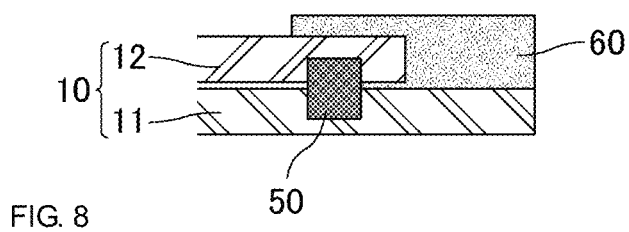
FIG. 7 is an enlarged sectional view schematically illustrating an example in which the protective film is positioned between an outer end portion of the second sheet and the bonded portion, and between the second sheet and the first sheet forming the step shape.
Figure 8:
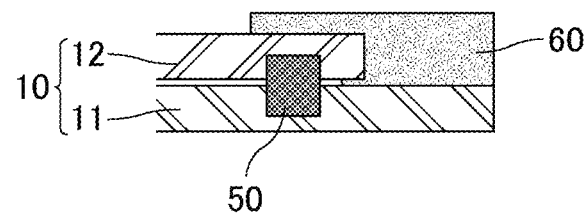
FIG. 8 is an enlarged sectional view schematically illustrating another example in which the protective film is positioned between the outer end portion of the second sheet and the bonded portion, and between the second sheet and the first sheet forming the step shape.

In the vapor chamber of the present invention, as illustrated in FIG. 7 or FIG. 8, the protective film may be positioned between the outer end portion of the second sheet 12 and the bonded portion, and between the second sheet 12 and the first sheet 11 forming the step shape. That is, the protective film may penetrate to a portion extending to the bonded portion between the second sheet 12 and the first sheet 11 forming the step shape.

When the protective film penetrates to the portion between the second sheet 12 and the first sheet 11 forming the step shape, the bonding strength may be increased.

FIG. 7 is an enlarged sectional view schematically illustrating an example in which the protective film is positioned between the outer end portion of the second sheet 12 and the bonded portion, and between the second sheet 12 and the first sheet 11 forming the step shape.

In FIG. 7, the protective film 60 penetrates entirely to the bonded portion 50 between the second sheet 12 and the first sheet 11 forming the step shape. Therefore, the protective film 60 is in contact with the bonded portion 50.

FIG. 8 is an enlarged sectional view schematically illustrating another example in which the protective film is positioned between the outer end portion of the second sheet 12 and the bonded portion, and between the second sheet 12 and the first sheet 11 forming the step shape.

In FIG. 8, the protective film 60 penetrate partially to the bonded portion 50 between the second sheet 12 and the first sheet 11 forming the step shape. Therefore, there is a gap between the protective film 60 and the bonded portion 50.

FIG. 7 and FIG. 8 are examples in which the protective film illustrated in FIG. 2 penetrates to a portion between the second sheet 12 and the first sheet 11 forming the step shape, and the protective film illustrated in any of FIG. 3, FIG. 4, FIG. 5, and FIG. 6A to FIG. 6F may penetrate to a portion between the second sheet 12 and the first sheet 11 forming the step shape.

In the vapor chamber of the present invention, the shape of the housing is not particularly limited. For example, the planar shape of the housing (shape viewed from above in FIG. 1) may be a polygonal shape such as a triangle or a rectangle, a circle, an ellipse, a combination thereof, or the like.

In the vapor chamber of the present invention, the outer edge of the housing is preferably formed in a step shape in which the end portion of the second sheet is positioned inside the end portion of the first sheet. However, it is acceptable that a part of the outer edge of the housing is formed in a step shape in which the end portion of the second sheet is positioned inside the end portion of the first sheet. For example, on the outer edge of the housing, a portion which does not have the step shape, that is, a portion where the end portions of the first sheet and the second sheet coincide with each other may exist and a portion formed in the step shape where the end portion of the first sheet is positioned inside the end portion of the second sheet may exist.

The distance between the end portion of the first sheet and the end portion of the second sheet is not particularly limited in the portion formed in the step shape where the end portion of the second sheet is positioned inside the end portion of the first sheet.

In the vapor chamber of the present invention, materials constituting the first sheet and the second sheet are not particularly limited as long as having characteristics suitable for use as a vapor chamber, for example, thermal conductivity, strength, flexibility and the like. The material constituting the first sheet and the second sheet is preferably a metal, such as copper, nickel, aluminum, magnesium, titanium, iron or the like, or an alloy containing any of these metals as a main component. It is particularly preferable that the material constituting the first sheet and the second sheet be copper or a copper alloy.

In the vapor chamber of the present invention, when the first sheet and the second sheet are both metal sheets, it is preferable that the first sheet and the second sheet be welded to each other at the bonded portion.

In the vapor chamber of the present invention, the material constituting the first sheet and the material constituting the second sheet may be different from each other. For example, by making both materials different from each other, one function may be obtained by the one sheet and another function may be obtained by the other sheet. The function described above is not particularly limited, and examples thereof include a heat conduction function and an electromagnetic wave shield function.

In the vapor chamber of the present invention, although the thickness of each of the first sheet and the second sheet is not particularly limited, when the first sheet and the second sheet are too thin, strength of the housing is decreased, and deformation is likely to occur. Therefore, the thickness of each of the first sheet and the second sheet is preferably about 20 μm or more, and more preferably about 30 μm or more. On the other hand, when the first sheet and the second sheet are too thick, it becomes difficult to reduce the thickness of the vapor chamber. Therefore, the thickness of each of the first sheet and the second sheet is preferably about 200 μm or less, more preferably about 150 μm or less, and still more preferably about 100 μm or less. The thickness of the first sheet and the thickness of the second sheet may be the same or different from each other.

In a case where the projecting portions constituting the wick are integral with the first sheet, the thickness of the first sheet is defined as the thickness of the portion not in contact with the projecting portions. In addition, when the struts are integral with the second sheet, the thickness of the second sheet is defined as the thickness of the portion not in contact with the struts.

In the vapor chamber of the present invention, the thickness of the first sheet may be constant, or a thick portion and a thin portion may exist. Similarly, the thickness of the second sheet may be constant, or a thick portion and a thin portion may exist. In addition, the second sheet in a portion not in contact with the struts may be dented into the housing.

In the vapor chamber of the present invention, the working fluid is not particularly limited as long as having a property causing a gas-liquid phase change in an environment inside the housing, and for example, water, alcohol, substitute freon or the like may be used. The working fluid is preferably an aqueous compound, and more preferably water.

In the vapor chamber of the present invention, the wick may be provided only on the inner wall surface of the first sheet, may be provided only on the inner wall surface of the second sheet, or may be provided on the inner wall surface of the first sheet and on the inner wall surface of the second sheet, as long as the wick is provided on the inner wall surface of the housing.

In the vapor chamber of the present invention, the wick is not particularly limited as long as having a capillary structure capable of moving the working fluid by capillary pressure. The capillary structure of the wick may be a known structure used in a vapor chamber of related art. The capillary structure may be a fine structure that has irregularities such as a pore, a groove, a protrusion, and the like. Examples of the fine structure include such as a porous structure, a fiber structure, a groove structure, a network structure, and the like.

In the vapor chamber of the present invention, it is preferable that the wick is continuously provided from an evaporation portion to a condensation portion in the housing. At least a part of the wick may be integral with the housing.

In the vapor chamber of the present invention, the wick includes, for example, a plurality of projecting portions disposed at predetermined intervals on the inner wall surface of the first sheet. The wick may further include a mesh, a nonwoven fabric or a porous body on the projecting portions. The wick may include the mesh, the nonwoven fabric, or the porous body directly disposed on the inner wall surface of the first sheet.

In the vapor chamber of the present invention, when the wick includes a plurality of projecting portions on the inner wall surface of the first sheet, the working fluid may be held between the projecting portions, so that the heat transportation capacity of the vapor chamber may be improved.

In this description, a projecting portion refers to a portion having a height higher than that of the surrounding portion, and also includes a concave portion which is formed on the inner wall surface, such as a portion which is relatively high in height due to a groove or the like, in addition to a portion protruding from the inner wall surface.

The shape of the projecting portion is not particularly limited, and examples thereof include a substantially columnar shape, a substantially prismatic shape, a substantially truncated cone shape, a substantially truncated pyramid shape, and the like. The shape of the projecting portion may be a substantially wall shape, that is, a shape in which a groove is formed between adjacent projecting portions.

The projecting portions may be integral with the first sheet, or may be formed with an etching process on the inner wall surface of the first sheet, for example.

In the vapor chamber of the present invention, it is preferable that a plurality of struts be provided between the first sheet and the second sheet in order to support the first sheet and the second sheet from inside.

Since the struts are disposed in the housing, it is possible to prevent the housing from being deformed when the housing is depressurized inside or when external pressure is applied from outside of the housing. The struts may support the first sheet or the second sheet directly contacting thereto, or may support the first sheet or the second sheet with other member such as the wick interposed therebetween.

The shape of the struts is not particularly limited, and examples thereof include a substantially columnar shape, a substantially prismatic shape, a substantially truncated cone shape, and a substantially truncated pyramid shape, and the like.

The arrangement of the struts is not particularly limited, but the struts are preferably disposed uniformly, for example, in a grid point so that the distances between the struts are constant. By uniformly disposing the struts, uniform strength may be ensured throughout the vapor chamber.

The struts are preferably provided on the inner wall surface of the second sheet. In this case, the struts may be integral with the second sheet, and for example, the struts may be formed by etching process of the inner wall surface of the second sheet.

In the vapor chamber of the present invention, a material constituting the protective film is not particularly limited, and examples thereof include a resin, a metal, and the like. Examples of the resin include a polyimide resin, a silicone resin, and the like. Examples of the metal include copper, silver, nickel, and the like, or an alloy containing any of these metals as a main component.

When the protective film is a resin film, the vapor chamber becomes tolerant to vibration and heat. On the other hand, when the protective film is a metal film, the protective film may be made thin, so that the entire vapor chamber may be made thinner.

In the vapor chamber of the present invention, it is preferable to make a combination in which the first sheet and the second sheet are metal sheets, and the protective film is a resin film. In particular, it is preferable to make a combination in which a material constituting the first sheet and the second sheet is copper or a copper alloy, and a material constituting the protective film is a polyimide resin.

In the vapor chamber of the present invention, when the protective film is provided so as to cover the boundary between the end portion of the second sheet and the first sheet forming the step shape, the area in which the protective film is provided is not particularly limited.

A method for manufacturing the vapor chamber of the present invention is not particularly limited as long as it is a method for obtaining the above structure. For example, a first sheet on which a wick is disposed and a second sheet on which struts are disposed are overlapped, and are bonded while leaving an opening for enclosing a working fluid, and the working fluid is put into a housing from the opening, and then the opening is sealed. At this time, the first sheet and the second sheet are bonded so as to have a step shape in which an end portion of the second sheet is positioned inside an end portion of the first sheet, and a protective film is formed so as to cover the boundary between the end portion of the second sheet and the first sheet forming the step shape.

A bonding method of the first sheet and the second sheet is not particularly limited, and examples thereof include laser welding, resistance welding, diffusion bonding, brazing, TIG welding (tungsten-inert gas welding), ultrasonic bonding, and resin sealing, or the like. Among these, laser welding, resistance welding, or brazing is preferred.

A method for forming the protective film is not particularly limited, and for example, when the protective film is a resin film, a method such as immersion, spin coating, dipping or the like are cited, and when the protective film is a metal film, a method such as plating may be cited.

The vapor chamber of the present invention is not limited to the above embodiments, and various applications and modifications may be made within the scope of the present invention in terms of the configuration of the vapor chamber, the manufacturing conditions, or the like.

The vapor chamber of the present invention may be suitably used as a heat dissipation device because of high heat transportation capacity and heat diffusion capability as described above.

Further, since the vapor chamber of the present invention is advantageous for miniaturization and particularly for reduction in thickness, it is suitable for use in a device requiring miniaturization, for example, an electronic device.

REFERENCE SIGNS LIST

1 VAPOR CHAMBER
10 HOUSING
11 FIRST SHEET
12 SECOND SHEET
13 CAVITY
20 WORKING FLUID
30 WICK
31 PROJECTING PORTION
32 MESH
40 STRUT
50 BONDED PORTION
60 PROTECTIVE FILM
X BOUNDARY BETWEEN END PORTION OF SECOND SHEET AND FIRST SHEET FORMING STEP SHAPE

The invention claimed is:
1. A vapor chamber comprising:
a housing having a first sheet and a second sheet facing each other, wherein at least a part of an outer edge of the housing has a step shape in which an end portion of the second sheet is positioned inside an end portion of the first sheet such that the first sheet has a first surface which partially defines the step shape and a second surface opposite to the first surface, and the housing has a bonded portion inside the end portion of the second sheet where the first sheet and the second sheet are bonded to each other;

a protective film covering a boundary between the end portion of the second sheet and the first sheet at the step shape and not covering the second surface of the first sheet;

a working fluid enclosed in the housing; and a wick on an inner wall surface of the first sheet or the second sheet.

2. The vapor chamber according to claim 1, wherein the protective film is on an outer wall surface of the second sheet in a portion of the housing where the first sheet and the second sheet are not in contact with each other.

3. The vapor chamber according to claim 2, wherein an outer circumferential end portion of the protective film coincides with the end portion of the first sheet.

4. The vapor chamber according to claim 2, wherein an outer circumferential end portion of the protective film is positioned inside the end portion of the first sheet.

5. The vapor chamber according to claim 1, wherein the entire outer edge of the housing has the step shape in which the end portion of the second sheet is positioned inside the end portion of the first sheet.

6. The vapor chamber according to claim 5, wherein the protective film is on an outer wall surface of the second sheet in a portion of the housing where the first sheet and the second sheet are not in contact with each other.

7. The vapor chamber according to claim 6, wherein an outer circumferential end portion of the protective film coincides with the end portion of the first sheet.

8. The vapor chamber according to claim 6, wherein an outer circumferential end portion of the protective film is positioned inside the end portion of the first sheet.

9. The vapor chamber according to claim 1, wherein an outer circumferential end portion of the protective film extends outside of the end portion of the first sheet.

10. The vapor chamber according to claim 1, wherein the protective film has a same thickness as that of the second sheet.

11. The vapor chamber according to claim 1, wherein the protective film is thinner than the second sheet.

12. The vapor chamber according to claim 1, wherein the protective film is between the end portion of the second sheet and the bonded portion, and between the second sheet and the first sheet.

13. The vapor chamber according to claim 1, wherein an outer circumferential end portion of the protective film coincides with the end portion of the first sheet.

14. The vapor chamber according to claim 1, wherein an outer circumferential end portion of the protective film is positioned inside the end portion of the first sheet.

15. The vapor chamber according to claim 1, wherein the first sheet and the second sheet are both metal sheets, and the first sheet and the second sheet are welded to each other at the bonded portion.

16. The vapor chamber according to claim 1, wherein the protective film is a resin film.

* * * * *